United States Patent
Kageyama et al.

(10) Patent No.: US 10,418,180 B2
(45) Date of Patent: Sep. 17, 2019

(54) ELECTRONIC COMPONENT AND MANUFACTURING METHOD FOR THE SAME

(71) Applicant: Murata Manufacturing Co., Ltd., Nagaokakyo-shi, Kyoto-fu (JP)

(72) Inventors: Tomohiro Kageyama, Nagaokakyo (JP); Tetsuo Kawakami, Nagaokakyo (JP); Manabu Sakai, Nagaokakyo (JP); Takashi Ohara, Nagaokakyo (JP); Takahiro Hirao, Nagaokakyo (JP); Ryuki Kakuta, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 283 days.

(21) Appl. No.: 15/451,768

(22) Filed: Mar. 7, 2017

(65) Prior Publication Data
US 2017/0263383 A1    Sep. 14, 2017

(30) Foreign Application Priority Data

Mar. 9, 2016    (JP) .................................. 2016-045270

(51) Int. Cl.
*H01L 41/09*    (2006.01)
*H01L 41/047*    (2006.01)
(Continued)

(52) U.S. Cl.
CPC .............. *H01G 4/308* (2013.01); *H01C 1/148* (2013.01); *H01C 7/18* (2013.01); *H01F 27/2804* (2013.01); *H01G 4/012* (2013.01); *H01G 4/1245* (2013.01); *H01G 4/232* (2013.01); *H01G 4/248* (2013.01); *H01G 4/30* (2013.01); *H01L 41/0471* (2013.01); *H01L 41/0472* (2013.01); *H01L 41/1876* (2013.01); *H01L 41/293* (2013.01);
(Continued)

(58) Field of Classification Search
CPC ...... H01L 41/042; H01L 41/09; H02M 3/155; H02N 2/06; F02M 51/0603
USPC .................................................. 310/317, 366
See application file for complete search history.

(56) References Cited

U.S. PATENT DOCUMENTS 5,840,216 A * 11/1998 Ohtani .................... H01B 1/16
                                                                   252/514
6,118,647 A    9/2000 Okinaka et al.
(Continued)

FOREIGN PATENT DOCUMENTS

JP    09-266131 A    10/1997
JP    10-294239 A    11/1998
(Continued)

OTHER PUBLICATIONS

Kageyama et al., "Electronic Component and Method for Manufacturing the Same," U.S. Appl. No. 15/810,275, filed Nov. 13, 2017.
Official Communication issued in corresponding Korean Patent Application No. 10-2017-0023031, dated Jul. 13, 2018.

*Primary Examiner* — Thomas M Dougherty
(74) *Attorney, Agent, or Firm* — Keating & Bennett, LLP

(57) ABSTRACT

In an electronic component, a first outer electrode includes a first conductive layer provided on a first end surface. A second outer electrode includes a second conductive layer provided on a second end surface. A first inner electrode passes through the first conductive layer. A second inner electrode passes through the second conductive layer.

14 Claims, 8 Drawing Sheets

(51) Int. Cl.

| | |
|---|---|
| *H01L 41/083* | (2006.01) |
| *H01G 4/30* | (2006.01) |
| *H01F 27/28* | (2006.01) |
| *H01G 4/012* | (2006.01) |
| *H01G 4/12* | (2006.01) |
| *H01G 4/248* | (2006.01) |
| *H01L 41/187* | (2006.01) |
| *H01L 41/293* | (2013.01) |
| *H01L 41/297* | (2013.01) |
| *H01C 1/148* | (2006.01) |
| *H01C 7/18* | (2006.01) |
| *H01G 4/232* | (2006.01) |
| *H01C 7/00* | (2006.01) |
| *H01F 17/00* | (2006.01) |
| *H01F 27/29* | (2006.01) |

(52) U.S. Cl.
CPC ............ *H01L 41/297* (2013.01); *H01C 7/008* (2013.01); *H01F 17/0013* (2013.01); *H01F 27/292* (2013.01); *H01F 2027/2809* (2013.01); *H01G 4/12* (2013.01)

(56) References Cited

U.S. PATENT DOCUMENTS

| | | | |
|---|---|---|---|
| 6,344,963 B1 | 2/2002 | Mori | |
| 2003/0168945 A1* | 9/2003 | Birgel | ................. H04R 17/005 |
| | | | 310/366 |
| 2007/0120448 A1* | 5/2007 | Miyoshi | .............. H01L 41/0471 |
| | | | 310/366 |
| 2014/0233148 A1* | 8/2014 | Jeon | ....................... H01G 4/005 |
| | | | 361/301.4 |

FOREIGN PATENT DOCUMENTS

| | | | | |
|---|---|---|---|---|
| JP | 10294239 A | * | 11/1998 | ............... H01G 4/12 |
| JP | 11-16764 A | | 1/1999 | |
| JP | 2000-277371 A | | 10/2000 | |
| JP | 2004-327739 A | | 11/2004 | |
| JP | 2009-246167 A | | 10/2009 | |
| JP | 2010-027730 A | | 2/2010 | |
| JP | 2010027730 A | * | 2/2010 | ............... H01C 7/04 |
| JP | 2012-230973 A | | 11/2012 | |
| WO | 2010/087221 A1 | | 8/2010 | |

\* cited by examiner

ELECTRONIC COMPONENT AND MANUFACTURING METHOD FOR THE SAME

CROSS REFERENCE TO RELATED APPLICATIONS

This application claims the benefit of priority to Japanese Patent Application No. 2016-045270 filed on Mar. 9, 2016. The entire contents of this application are hereby incorporated herein by reference.

BACKGROUND OF THE INVENTION

1. Field of the Invention

The present invention relates to electronic components and manufacturing methods therefor.

2. Description of the Related Art

A large number of electronic components such as multilayer ceramic capacitors, for example, have been used in a variety of electronic apparatuses. For example, Japanese Unexamined Patent Application Publication No. 2000-277371 discloses, as an example of an electronic component, a multilayer ceramic electronic component having an outer electrode that is provided only on an end surface of a capacitor main body formed in a substantially rectangular parallelepiped shape and includes a conductive layer to which an inner electrode is connected.

SUMMARY OF THE INVENTION

There has been a request for improvement in reliability of connection between an inner electrode and an outer electrode of an electronic component.

Preferred embodiments of the present invention provide electronic components having high reliability of connection between an inner electrode and an outer electrode.

An electronic component according to a preferred embodiment of the present invention includes an electronic component main body, a first inner electrode, a second inner electrode, a first outer electrode, and a second outer electrode. The electronic component main body includes first and second principal surfaces, first and second side surfaces, and first and second end surfaces. The first and second principal surfaces extend along a lengthwise direction and a width direction. The first and second side surfaces extend along the lengthwise direction and a lamination direction. The first and second end surfaces extend along the width direction and the lamination direction. The first inner electrode is provided inside the electronic component main body. The second inner electrode is provided inside the electronic component main body. The first outer electrode is provided on the first end surface and is connected to the first inner electrode. The second outer electrode is provided on the second end surface and is connected to the second inner electrode. The first outer electrode includes a first conductive layer provided on the first end surface. The second outer electrode includes a second conductive layer provided on the second end surface. The first inner electrode passes through (penetrates through) the first conductive layer.

In an electronic component according to a preferred embodiment of the present invention, it is preferable for the second inner electrode to pass through the second conductive layer.

In an electronic component according to an preferred embodiment of the present invention, the first outer electrode may further include a third conductive layer provided on the first conductive layer; of the first and third conductive layers, at least the first conductive layer may include ceramic particles; and an amount of ceramic particles contained in the first conductive layer may be greater than an amount of ceramic particles contained in the third conductive layer.

In an electronic component according to a preferred embodiment of the present invention, the second outer electrode may further include a fourth conductive layer provided on the second conductive layer; of the second and fourth conductive layers, at least the second conductive layer may contain ceramic particles; and an amount of ceramic particles contained in the second conductive layer may be greater than an amount of ceramic particles contained in the fourth conductive layer.

In an electronic component according to a preferred embodiment of the present invention, it is preferable for the third conductive layer to be separated from the electronic component main body by the first conductive layer.

In an electronic component according to a preferred embodiment of the present invention, it is preferable for the fourth conductive layer to be separated from the electronic component main body by the second conductive layer.

In an electronic component according to a preferred embodiment of the present invention, it is preferable that a portion of the first inner electrode inside the first conductive layer has a curved or substantially curved shape when viewed in a width direction.

In an electronic component according to a preferred embodiment of the present invention, it is preferable that a portion of the second inner electrode inside the second conductive layer has a curved or substantially curved shape when viewed in the width direction.

A manufacturing method for an electronic component according to a preferred embodiment of the present invention relates to a manufacturing method for an electronic component including an electronic component main body which includes first and second principal surfaces extending along a lengthwise direction and a width direction, first and second side surfaces extending along the lengthwise direction and a lamination direction, and first and second end surfaces extending along the width direction and the lamination direction; a first inner electrode provided inside the electronic component main body; a second inner electrode provided inside the electronic component main body; a first outer electrode provided on the first end surface and connected to the first inner electrode; and a second outer electrode provided on the second end surface and connected to the second inner electrode, wherein the first outer electrode includes a first conductive layer provided on the first end surface, the second outer electrode includes a second conductive layer provided on the second end surface, and the first inner electrode passes through the first conductive layer.

A manufacturing method for an electronic component according to a preferred embodiment of the present invention performs forming of a first green sheet including a ceramic paste layer to form the electronic component main body and a conductive paste layer to form the first conductive layer. On the first green sheet, a conductive paste layer to form the first inner electrode is formed on the ceramic paste layer and on the conductive paste layer to form the first conductive layer. Then, on the first green sheet where the conductive paste layer to form the first inner electrode is formed, forming of a second green sheet including a ceramic paste layer to form the electronic component main body and a conductive paste layer to form the first conductive layer is performed on the conductive paste layer to form the first inner electrode.

In a manufacturing method for an electronic component according to a preferred embodiment of the present invention, it is preferable to form the ceramic paste layer and the conductive paste layer by an ink jet technique.

According to various preferred embodiments of the present invention, electronic components having high reliability of connection between inner electrodes and outer electrodes as well as having low ESR (equivalent series resistance) are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
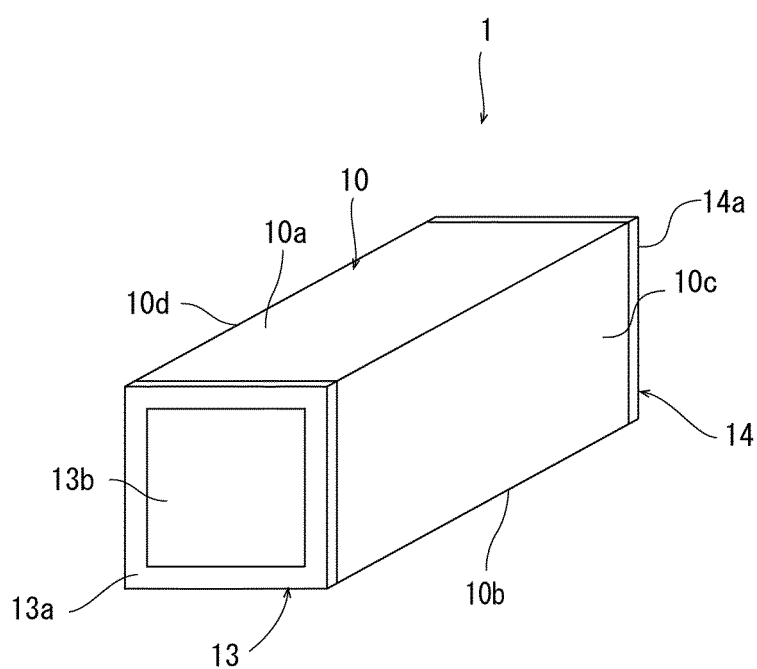
FIG. 1 is a schematic perspective view of an electronic component according to a first preferred embodiment of the present invention.

Hereinafter, examples of preferred embodiments of the present invention will be described. It is to be noted that the following preferred embodiments are merely examples. The present invention is not limited to the following preferred embodiments in any way.

In the drawings referred to in the description of the preferred embodiments or the like, elements or features substantially having the same functions will be referred to with identical reference numerals. Further, the drawings referred to in the preferred embodiments or the like are schematically illustrated. As such, the ratios of dimensions and the like of objects depicted in the drawings differ from the actual ratios of dimensions and the like of those objects in some cases. The ratios of dimensions and the like of the objects differ from drawing to drawing as well in some cases. The specific ratios of dimensions and the like of objects should be understood in consideration of the following descriptions.

First Preferred Embodiment

Figure 2:
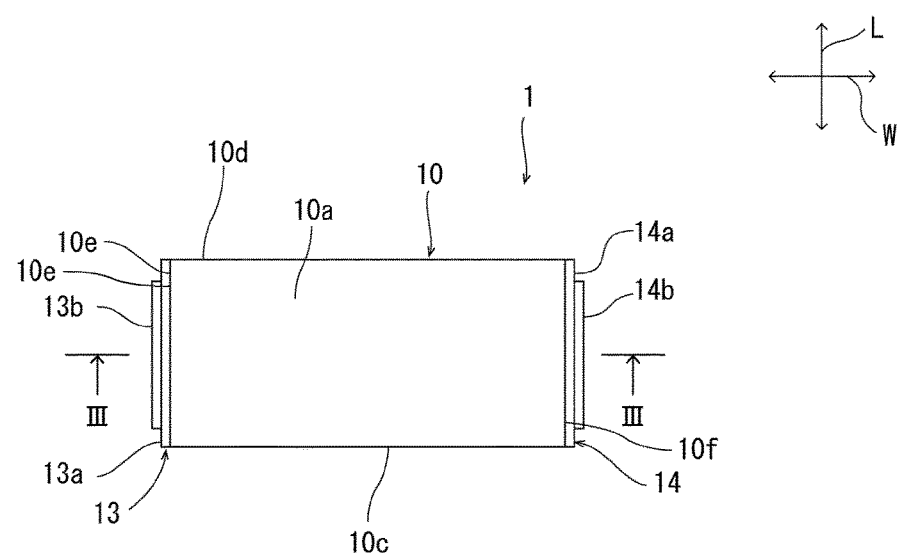
FIG. 2 is a schematic plan view of the electronic component according to the first preferred embodiment of the present invention.
Figure 3:
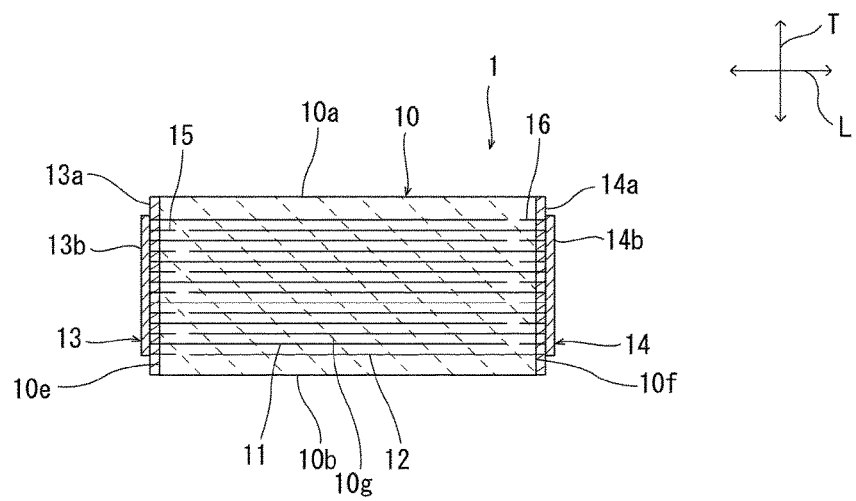
FIG. 3 is a schematic cross-sectional view taken along a III-III line in FIG. 2.

FIG. 1 is a schematic perspective view of an electronic component according to a first preferred embodiment of the present invention. FIG. 2 is a schematic plan view of the electronic component according to the first preferred embodiment. FIG. 3 is a schematic cross-sectional view taken along a III-III line in FIG. 2.

An electronic component 1 shown in FIGS. 2 and 3 may be a ceramic capacitor, a piezoelectric component, a thermistor, an inductor, or the like, for example.

The electronic component 1 includes an electronic component main body 10 preferably with a rectangular or substantially rectangular parallelepiped shape, for example. The electronic component main body 10 includes first and second principal surfaces 10a and 10b (see FIG. 3), first and second side surfaces 10c and 10d (see FIG. 2), and first and second end surfaces 10e and 10f. The first and second principal surfaces 10a and 10b extend along a lengthwise direction L and a width direction W. The first and second side surfaces 10c and 10d extend along a lamination direction T and the lengthwise direction L. The first and second end surfaces 10e and 10f extend along the lamination direction T and the width direction W. The lengthwise direction L, the width direction W, and the lamination direction T are orthogonal to one another.

Note that in the preferred embodiments of the present invention, a "rectangular parallelepiped shape" includes a rectangular parallelepiped shape of which corners and ridges are rounded. In other words, a member formed in a rectangular parallelepiped shape refers to a general member having first and second principal surfaces, first and second side surfaces, and first and second end surfaces. Unevenness or the like may be provided in a portion of or all of the principal surfaces, the side surfaces, and the end surfaces.

The dimensions of the electronic component main body 10 are not limited to any specific ones. For example, it is preferable that a thickness dimension of the electronic component main body 10 be no less than about 0.2 mm and no more than about 5 mm, a lengthwise dimension thereof be no less than about 0.3 mm and no more than about 40 mm, and a width dimension thereof be no less than about 0.1 mm and no more than about 50 mm.

The electronic component main body 10 may include an appropriate insulation material such as ceramics or the like in accordance with a function of the electronic component 1. To be specific, the electronic component 1 may be formed with dielectric ceramics in the case where the electronic component 1 is a capacitor. As a specific example of dielectric ceramics, $BaTiO_3$, $CaTiO_3$, $SrTiO_3$, $BaCaTiO_3$, $CaZrO_3$, or the like can be used, for example. In the case where the electronic component 1 is a capacitor, an accessary ingredient such as a Mn compound, Mg compound, Si compound, Al compound, V compound, Fe compound, Cr compound, Co compound, Ni compound, rare earth compound, or the like may be appropriately added to the electronic component main body 10, for example, in accordance with characteristics required to the electronic component 1.

In the case where the electronic component 1 is a piezoelectric component, the electronic component main body may be formed with piezoelectric ceramics. As a specific example of piezoelectric ceramics, PZT (lead zirconate titanate) based ceramics or the like can be cited, for example.

In the case where the electronic component 1 is a thermistor, the electronic component main body may be formed with semiconductor ceramics. As a specific example of semiconductor ceramics, spinel-based ceramics or the like may be cited, for example.

In the case where the electronic component 1 is an inductor, the electronic component main body may be formed with magnetic ceramics. As a specific example of magnetic ceramics, ferrite ceramics or the like can be cited, for example.

In the present preferred embodiment, an example in which the electronic component 1 is a multilayer ceramic capacitor will be hereinafter described. To be specific, in this preferred embodiment, an example in which the electronic component 1 is a multilayer ceramic capacitor including two outer electrodes will be described. Note that, however, the present invention is not limited thereto. The electronic component according to a preferred embodiment of the present invention may be a multilayer capacitor including three or more outer electrodes.

As shown in FIG. 3, inner electrodes are provided inside the electronic component main body 10. To be specific, a plurality of first inner electrodes 11 and a plurality of second inner electrodes 12 are provided inside the electronic component main body 10.

The first inner electrodes 11 preferably have a rectangular or substantially rectangular shape, for example. The first inner electrodes 11 are provided parallel or substantially parallel to the first and second principal surfaces 10a and 10b. In other words, the first inner electrodes 11 are provided along the lengthwise direction L and the width direction W. The first inner electrodes 11 are exposed to the first end surface 10e, but are not exposed to any of the first and second principal surfaces 10a and 10b, the first and second side surfaces 10c and 10d, and the second end surface 10f.

The second inner electrodes 12 preferably have a rectangular or substantially rectangular shape. The second inner electrodes 12 are provided parallel or substantially parallel to the first and second principal surfaces 10a and 10b. In other words, the second inner electrodes 12 are provided along the lengthwise direction L and the width direction W. As such, the second inner electrodes 12 and the first inner electrodes 11 are parallel or substantially parallel to each other. The second inner electrodes 12 are exposed to the second end surface 10f, but are not exposed to any of the first and second principal surfaces 10a and 10b, the first and second side surfaces 10c and 10d, and the first end surface 10e.

The first and second inner electrodes 11 and 12 are alternately provided along the lamination direction T. The first inner electrode 11 and the second inner electrode 12 being adjacent in the lamination direction T oppose each other with a dielectric layer 10g interposed therebetween. The thickness of the dielectric layer 10g may be, for example, no less than about 0.2 µm and no more than about 40 µm. It is preferable that a distance between the first principal surface 10a and the inner electrodes 11, 12 positioned at the most first principal surface 10a side and a distance between the second principal surface 10b and the inner electrodes 11, 12 positioned at the most second principal surface 10b side be no less than about 20 µm and no more than about 500 µm, for example.

The first and second inner electrodes 11 and 12 may include an appropriate conductive material. For example, the first and second inner electrodes 11 and 12 may include a metal selected from a group including Ni, Cu, Ag, Pd, and Au, or with an alloy containing at least one or more metals selected from the group including Ni, Cu, Ag, Pd, and Au (for example, a Ag—Pd alloy or the like).

The first and second inner electrodes 11 and 12 may further contain ceramic particles. It is preferable for the ceramic particles to contain a common material which is the same type of ingredient as an ingredient (ceramic ingredient) contained in the electronic component main body 10. It is preferable for an amount of ceramic particles contained in the first and second internal electrodes 11 and 12 to be equal to or smaller than about 20 volume %, and more preferably to be equal to or smaller than about 15 volume %, for example.

It is preferable for the thickness of each of the first and second inner electrodes 11 and 12 to be no less than about 0.2 µm and no more than about 3 µm, for example.

As shown in FIGS. 2 and 3, the electronic component 1 includes first and second outer electrodes 13 and 14. The first outer electrode 13 is electrically connected to the first inner electrode 11. Meanwhile, the second outer electrode 14 is electrically connected to the second inner electrode 12.

The first outer electrode 13 is provided on the first end surface 10e. In this preferred embodiment, an example in which the outer electrode 13 is formed only on the first end surface 10e will be described. However, the present invention is not limited thereto. For example, the first outer electrode may extend across the first end surface and at least one of the first and second principal surfaces and the first and second side surfaces.

The first outer electrode 13 includes a conductive layer (first conductive layer) 13a and a conductive layer (third conductive layer) 13b. The conductive layer 13a is provided on the first end surface 10e. The conductive layer 13b is provided on the conductive layer 13a. That is, the conductive layers 13a and 13b are laminated on the first end surface 10e in that order. The conductive layer 13b is separated from the electronic component main body 10 by the conductive layer 13a.

The thickness of the conductive layer 13a may be, for example, no less than about 10 µm and no more than about 200 µm. The thickness of the conductive layer 13b may be, for example, no less than about 0.1 µm and no more than about 10 µm. It is preferable for the thickness of the conductive layer 13a to be no less than about the same as the thickness of the conductive layer 13b and no more than about 200 times the thickness thereof, and more preferably to be no less than about 10 times and no more than about 200 times the thickness thereof.

In the present preferred embodiment, the conductive layer 13a and the conductive layer 13b each preferably include a calcined electrode. The conductive layer 13a and the conductive layer 13b each include a conductive material such as metal or the like. Each of the conductive layers 13a and 13b may include glass or the like in addition to the conductive material. It is preferable that, of the conductive layers 13a and 13b, at least the conductive layer 13a contain ceramic particles. It is preferable for the ceramic particles to contain a common material which is the same type of ingredient as an ingredient (ceramic ingredient) contained in the electronic component main body 10. It is preferable for the conductive material included in the conductive layers 13a and 13b to contain, for example, at least one material selected from a group including Cu, Ni, Ag, Pd, Ag—Pd alloy, and Au, and more preferably to contain Cu.

It is preferable for an amount of ceramic particles contained in the conductive layer 13a to be no less than about 30 volume % and no more than about 70 volume %, and more preferably to be no less than about 40 volume % and no more than about 60 volume %, for example.

It is preferable for an amount of ceramic particles contained in the conductive layer 13b to be no less than about 0 volume % and no more than about 20 volume %, and more preferably to be no less than about 0 volume % and no more than about 10 volume %, for example.

It is preferable for the amount of ceramic particles contained in the conductive layer (first conductive layer) 13a to be greater than the amount of ceramic particles contained in the conductive layer (third conductive layer) 13b, more preferably to be no less than about 1.5 times the amount of ceramic particles contained in the conductive layer (third conductive layer) 13b, and further more preferably to be no less than about twice, for example.

The contained amount of ceramic particles can be determined as follows.

First, the first side surface of the electronic component is polished parallel or substantially parallel to the second side surface until the width thereof becomes about half the width before the polishing, and abrasive sagging is removed by ion milling, thus exposing a cross section.

Next, a portion of the exposed cross section having an area of about $5.0 \times 10^{-4}$ mm$^2$ preferably is selected as a measurement range, for example. In the selection of the measurement range, a portion in which fewer voids or deformations are present is preferably selected.

Subsequently, an area occupied by the ceramic particles and an area occupied by the metal in the electrode or the conductive layer are measured. Further, an area of the electrode or the conductive layer is measured. The area of the electrode or the conductive layer is the total of the area occupied by the metal and the area occupied by the ceramic particles. Then, a contained amount of the ceramic particles is determined using a formula given below. To be specific, the cross section is observed under a scanning microscope to distinguish a portion occupied by the metal and a portion occupied by the ceramic particles based on a difference in image contrast of the reflected electron image. Then, an image analysis is carried out so as to calculate the areas of the portion occupied by the metal and the portion occupied by the ceramic particles. In the case where there are voids inside the measurement range, or in the case where a material of the dielectric layer enters into the electrode, the conductive layer, or the like caused by deformation or the like generated during calcination, the contained amount of the ceramic particles is calculated while ignoring an area of such an entering portion.

(contained amount of ceramic particles)=(area of ceramic particle in electrode or conductive layer)/area of electrode or conductive layer)

The second outer electrode 14 is provided on the second end surface 10f. In this preferred embodiment, an example in which the outer electrode 14 is provided only on the second end surface 10f will be described. However, the present invention is not limited thereto. For example, the second outer electrode may extend across the second end surface and at least one of the first and second principal surfaces and the first and second side surfaces.

The second outer electrode 14 includes a conductive layer (second conductive layer) 14a and a conductive layer (fourth conductive layer) 14b. The conductive layer 14a is provided on the second end surface 10f. The conductive layer 14b is provided on the conductive layer 14a. That is, the conductive layers 14a and 14b are laminated on the second end surface 10f in that order. The conductive layer 14b is separated from the electronic component main body 10 by the conductive layer 14a.

The thickness of the conductive layer 14a may be, for example, no less than about 10 μm and no more than about 200 μm. The thickness of the conductive layer 14b may be, for example, no less than about 0.1 μm and no more than about 10 μm. It is preferable for the thickness of the conductive layer 14a to be no less than about the same as the thickness of the conductive layer 14b and no more than about 200 times the thickness thereof, and more preferably to be no less than about 10 times and no more than about 200 times the thickness thereof, for example.

In the present preferred embodiment, the conductive layer 14a and the conductive layer 14b each include a calcined electrode. The conductive layer 14a and the conductive layer 14b each include a conductive material such as metal or the like. Each of the conductive layers 14a and 14b may further include glass in addition to the conductive material. It is preferable that, of the conductive layers 14a and 14b, the conductive layer 14a contain ceramic particles. It is preferable for the ceramic particles to contain a common material which is the same type of ingredient as an ingredient (ceramic ingredient) contained in the electronic component main body 10. It is preferable for the conductive particles included in the conductive layers 14a and 14b to contain, for example, at least one material selected from a group including Cu, Ni, Ag, Pd, Ag—Pd alloy, and Au, and more preferably to contain Cu.

It is preferable for an amount of ceramic particles contained in the conductive layer 14a to be no less than about 30 volume % and no more than about 70 volume %, and more preferably to be no less than about 40 volume % and no more than about 60 volume %, for example. It is preferable for an amount of ceramic particles contained in the conductive layer 14b to be no less than about 0 volume % and no more than about 20 volume %, and more preferably to be no less than about 0 volume % and no more than about 10 volume %, for example.

It is preferable for the amount of ceramic particles contained in the conductive layer (second conductive layer) 14a to be greater than the amount of ceramic particles contained in the conductive layer (fourth conductive layer) 14b, more preferably to be no less than about 1.5 times the amount of ceramic particles contained in the conductive layer (fourth conductive layer) 14b, and further more preferably to be no less than about twice, for example.

By providing the first conductive layer 13a, the second conductive layer 14a, and the like to include ceramic particles such as a common material or the like whose coefficient of thermal expansion is close to that of the electronic component main body 10, the generation of a crack, peeling-off, or the like is able to be prevented in the electronic component main body 10. Further, by making the amount of ceramic particles in the third conductive layer 13b, the fourth conductive layer 14b, and the like be relatively small, platability and adhesiveness with respect to surfaces of the third conductive layer 13b, the fourth conductive layer 14b and the like, joint strength when a metal terminal is connected to each of the third conductive layer 13b, the fourth conductive layer 14b, and so on is able to be enhanced.

A coefficient of thermal expansion of the insulation material such as ceramics of the electronic component main body 10 and a coefficient of thermal expansion of the conductive material such as metal of the first outer electrode 13 and the second outer electrode 14 are largely different from each other. Because of this, stress is generated due to shrinkage, expansion, or the like caused by a change in temperature during calcination or the like, such that there arises a case in which a crack is generated in the electronic component main body, the outer electrode is peeled off the electronic component main body, or the like. The generation of a crack, peeling-off, or the like is able to be prevented in the electronic component main body 10 by making the first conductive layer 13a, the second conductive layer 14a, and the like contain ceramic particles such as a common material or the like whose coefficient of thermal expansion is close to that of the electronic component main body 10.

In the case where the inner electrode and the outer electrode make contact with each other on the end surface of the electronic component main body, there is a case in which the inner electrode and the outer electrode are separated from each other due to shrinkage during calcination, shrinkage caused by a change in temperature, or the like, thus lowering the reliability of connection between the inner electrode and the outer electrode.

In the present preferred embodiment, the first inner electrode 11 passes through the conductive layer 13a, and the second inner electrode 12 passes through the conductive layer 14a. This causes a contact area between the first inner electrode 11 and the conductive layer 13a to be large, and also causes a contact area between the second inner electrode 12 and the conductive layer 14a to be large. Accordingly, in the electronic component 1, the reliability of connection between the first inner electrode 11 and the first outer electrode 13 is high, and the reliability of connection between the second inner electrode 12 and the second outer electrode 14 is also high. In addition, the ESR of the electronic component 1 is able to be lowered.

In a conductive path between the conductive layer 13b and the conductive layer 14b, a rate occupied by the conductive layers 13a and 14a in which the contained amounts of ceramic particles are large and electric resistance is high becomes small. This causes the ESR between the conductive layer 13b and the conductive layer 14b to be low in the electronic component 1 being mounted. As such, the ESR of the electronic component 1 is low.

Note that, however, it is not absolutely necessary for all the inner electrodes 11 to pass through the conductive layer 13a. It is not absolutely necessary for all the inner electrodes 12 to pass through the conductive layer 14a. Further, it is not absolutely necessary for the inner electrode 11 to pass through the conductive layer 13a across the whole region in the width direction W. It is not absolutely necessary for the inner electrode 12 to pass through the conductive layer 14a across the whole region in the width direction W.

In the electronic component 1 according to the present preferred embodiment, the conductive layers 13b and 14b, each of which includes a small amount of ceramic particles and has a significantly different rate of shrinkage from that of the electronic component main body 10, are respectively separated from the electronic component main body 10 by the conductive layers 13a and 14a, each of which contains a large amount of ceramic particles and has a rate of shrinkage being close to that of the electronic component main body 10. As such, the conductive layers 13b, 14b and the electronic component main body 10, having significantly different rates of shrinkage caused by a change in temperature during calcination or the like, are separated from each other by the conductive layers 13a and 14a of which rates of shrinkage caused by a change in temperature during calcination or the like are approximate to the rate of shrinkage of the electronic component main body 10. Accordingly, a crack or the like is unlikely to be generated in the electric component main body 10, the conductive layers 13a, 14a, 13b and 14b, or the like in the case where the electronic component 1 is manufactured by calcination, or in the case where a temperature of the electronic component 1 changes.

In the electronic component 1 according to the present preferred embodiment, auxiliary electrodes 15 and 16 may be provided, in addition to the inner electrodes 11 and 12, inside the electronic component main body 10. The auxiliary electrode 15 is connected to the first outer electrode 13. The auxiliary electrode 15 does not substantially contribute to capacitance formation because it does not oppose the second inner electrode 12. The auxiliary electrode 16 is connected to the second outer electrode 14. The auxiliary electrode 16 does not substantially contribute to capacitance formation because it does not oppose the first inner electrode 11. By providing the auxiliary electrode 15 extending into the inside of the conductive layer 13a and providing the auxiliary electrode 16 extending into the inside of the conductive layer 14a, the reliability of connection as well as the joint strength between the first inner electrode 11 and the first outer electrode 13, and the reliability of connection as well as the joint strength between the second inner electrode 12 and the second outer electrode 14 is able to be enhanced.

It is preferable for the auxiliary electrode 15 to pass through the conductive layer 13a, and for the auxiliary electrode 16 to pass through the conductive layer 14a. This makes it possible to further enhance the reliability of connection as well as the joint strength between the first inner electrode 11 and the first outer electrode 13, and the reliability of connection as well as the joint strength between the second inner electrode 12 and the second outer electrode 14.

Next, a non-limiting example of a manufacturing method for the electronic component 1 will be described hereinafter.

First, the electronic component main body 10 including the first and second inner electrodes 11 and 12 is prepared. To be specific, the electronic component 1 is molded by an ink jet technique using a ceramic paste and a conductive paste to complete the electronic component 1.

To be more specific, a ceramic paste to form the dielectric layer 10g containing ceramic powder and a conductive paste to form the inner electrodes 11 and 12, the conductive layers 13a, 13b, 14a and 14b, and the auxiliary electrodes 15 and 16 are prepared. By appropriately applying these pastes using the ink jet technique or the like, for example, green sheets are manufactured. Specifically, a green sheet including a ceramic paste layer to form the dielectric layer 10g (electronic component main body 10) and conductive paste layers to form the conductive layers 13a and 14a is formed (first green sheet formation process). In the green sheet formed in the first green sheet formation process, both end portions thereof in the lengthwise direction L are provided with the conductive paste layers, and a portion between these two conductive paste layers is provided with the ceramic paste layer. Note that a plurality of green sheets may be laminated by repeatedly applying the pastes a plurality of times in the first green sheet formation process.

Next, by applying a conductive paste layer to form the first inner electrode 11 and applying a conductive paste layer to form the auxiliary electrode 16 on the green sheet using the ink jet technique, the conductive paste layers to form the first inner electrode 11 and the auxiliary electrode 16 are formed (first process). In the first process, the conductive paste is applied so that the conductive paste hangs down from both the end portions in the lengthwise direction L of the green sheet. This conductive paste forms a conductive paste section to form each of the third conductive layer 13b and the fourth conductive layer 14b. Further, in the first process, on the conductive paste layer having been formed to form the conductive layer 13a in the green sheet formation process, a conductive paste layer to form the first inner electrode 11 is formed so as to extend to the upper portion of a leading end of the conductive paste layer to form the conductive layer 13a. By doing so, the first inner electrode 11 passing through the first conductive layer 13a is able to be formed. Furthermore, on the conductive paste layer having been formed to define the conductive layer 14a in the first green sheet formation process, a conductive paste layer to form the auxiliary electrode 16 is so formed as to extend to the upper portion of a leading end of the conductive paste layer to form the conductive layer 14a. By doing so, the auxiliary electrode 16 passing through the second conductive layer 14a is able to be formed.

Subsequently, on the green sheet where the conductive paste layer to form the first inner electrode 11 is formed, by using the ink jet technique, a ceramic paste and a conductive paste to form the conductive layer 13a are applied so as to cover the conductive paste layer to form the first inner electrode 11, and a ceramic paste and a conductive paste to form the conductive layer 14a are applied so as to cover the conductive paste layer to form the auxiliary electrode 16, thereby forming another green sheet (second green sheet formation process). In the green sheet formed in the second green sheet formation process, both end portions thereof in the lengthwise direction L include the conductive paste layers, and a portion between these two conductive paste layers includes the ceramic paste layer.

Next, on the green sheet manufactured in the second green sheet formation process, a conductive paste layer to form the second inner electrode 12 and a conductive paste layer to form the auxiliary electrode 15 are formed (second process). In the second process, the conductive paste is applied so that the conductive paste hangs down from both the end portions in the lengthwise direction L of the green sheet. This conductive paste forms a conductive paste section to form each of the third conductive layer 13b and the fourth conductive layer 14b. The conductive paste sections formed in the second process to form the third conductive layer 13b and the fourth conductive layer 14b are respectively connected to the conductive paste sections formed in the first process to form the third conductive layer 13b and the fourth conductive layer 14b. In the second process, on the conductive paste layer having been formed to form the second conductive layer 14a in the second green sheet formation process, a conductive paste layer to form the second inner electrode 12 is so formed as to extend to the upper portion of a leading end of the conductive paste layer. By doing so, the second inner electrode 12 passing through the second conductive layer 14a is able to be formed. Furthermore, on the conductive paste layer having been formed to form the conductive layer 13a in the second green sheet formation process, a conductive paste layer to form the auxiliary electrode 15 is formed so as to extend to the upper portion of a leading end of the conductive paste layer to form the conductive layer 13a. By doing so, the auxiliary electrode 15 passing through the first conductive layer 13a is able to be formed.

Next, on the green sheet where the conductive paste layer to form the second inner electrode 12 is formed, by using the ink jet technique or the like, a ceramic paste and a conductive paste to form the conductive layer 14a are applied so as to cover the conductive paste layer to form the second inner electrode 12, and a ceramic paste and a conductive paste to form the conductive layer 13a are applied so as to cover the conductive paste layer to form the auxiliary electrode 15, thus forming another green sheet (third green sheet formation process). In the third green sheet formation process, a plurality of ceramic green sheets may be laminated and formed in accordance with characteristics or the like required to the electronic component 1 to be manufactured.

Next, on a multilayer body obtained by repeating the first process, the second green sheet formation process, the second process, and the third green sheet formation process, another multilayer body in which the plurality of green sheets are formed in the same manner as the first green sheet formation process is calcined, thus manufacturing the electronic component main body 10 (calcination process).

A calcination temperature, a calcination time, and the like of the multilayer body is able to be appropriately set depending on a material or the like to be used. The calcination temperature of a calcination target body may be set to be no less than about 1,100° C. and no more than about 1,400° C., for example. The calcination time of the calcination target body may be set to be no less than about one hour and no more than about 20 hours, for example. Further, prior to the calcination of the multilayer body, degreasing may be carried out so as to remove an organic component such as a binder or the like contained in the multilayer body.

The electronic component 1 may be completed by carrying out the above-discussed processes, for example.

As in the present preferred embodiment, by molding the electronic component 1 using the ink jet technique, the electronic component 1 is able to be molded with ease. The electronic component 1 may be molded using other techniques than the ink jet technique such as a screen printing technique or the like.

Hereinafter, other examples of preferred embodiments of the present invention will be described. In the following description, elements and features substantially having the same functions as those in the first preferred embodiment are referred to with the same reference numerals and description thereof will be omitted.

Second Preferred Embodiment

Figure 4:
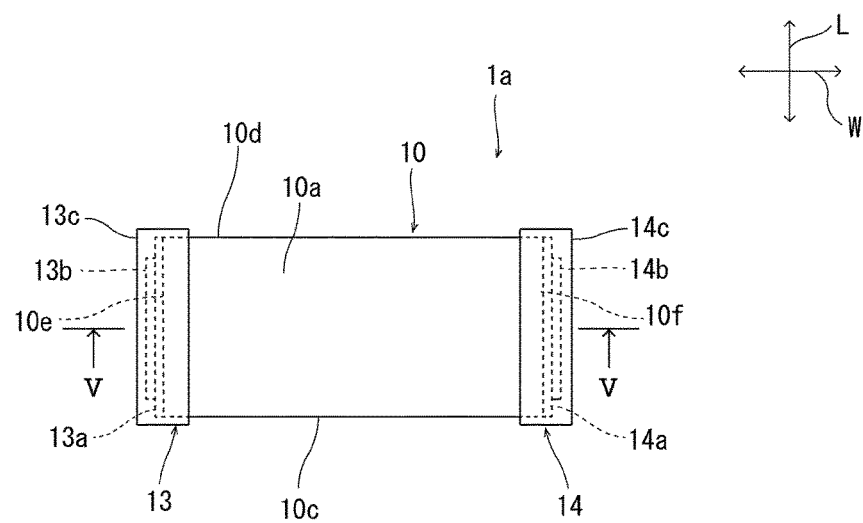
FIG. 4 is a schematic plan view of an electronic component according to a second preferred embodiment of the present invention.
Figure 5:
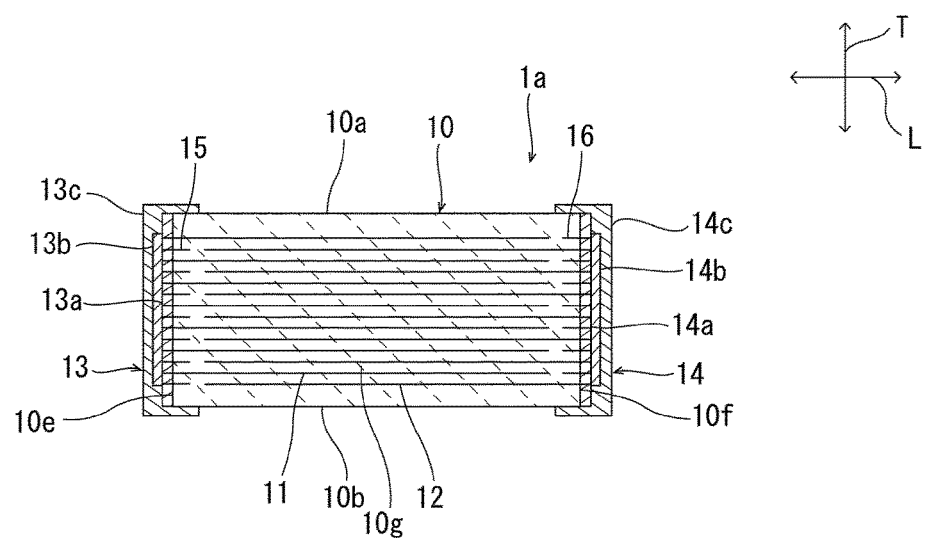
FIG. 5 is a schematic cross-sectional view taken along a V-V line in FIG. 4.

FIG. 4 is a schematic plan view of an electronic component according to a second preferred embodiment of the present invention. FIG. 5 is a schematic cross-sectional view taken along a V-V line in FIG. 4.

An electronic component 1a shown in FIGS. 4 and 5 differs from the electronic component 1 according to the first preferred embodiment in a point that the first outer electrode 13 further includes a conductive layer 13c covering the conductive layers 13a and 13b, and the second outer electrode 14 further includes a conductive layer 14c covering the conductive layers 14a and 14b. The conductive layer 13c extends from an upper area of the first end surface 10e where the conductive layers 13a and 13b are located so as to reach the first and second principal surfaces 10a, 10b and the first and second side surfaces 10c, 10d. The conductive layer 14c extends from an upper area of the second end surface 10f where the conductive layers 14a and 14b are located so as to reach the first and second principal surfaces 10a, 10b and the first and second side surfaces 10c, 10d. Providing these conductive layers 13c and 14c makes it easy to mount the electronic component 1a on a mounting substrate, for example. In addition, mounting strength of the electronic component 1a to the mounting substrate is enhanced.

The conductive layers 13c and 14c may be formed in a manner in which conductive paste layers having been applied by the ink jet technique, the screen printing technique, or the like are calcined, or in a manner in which conductive paste layers are formed with a conductive paste caused to make contact with end portions of the multilayer body and the conductive paste layers are then calcined.

A plating layer may be provided on a surface of each of the conductive layers 13c and 14c.

Third Preferred Embodiment

Figure 6:
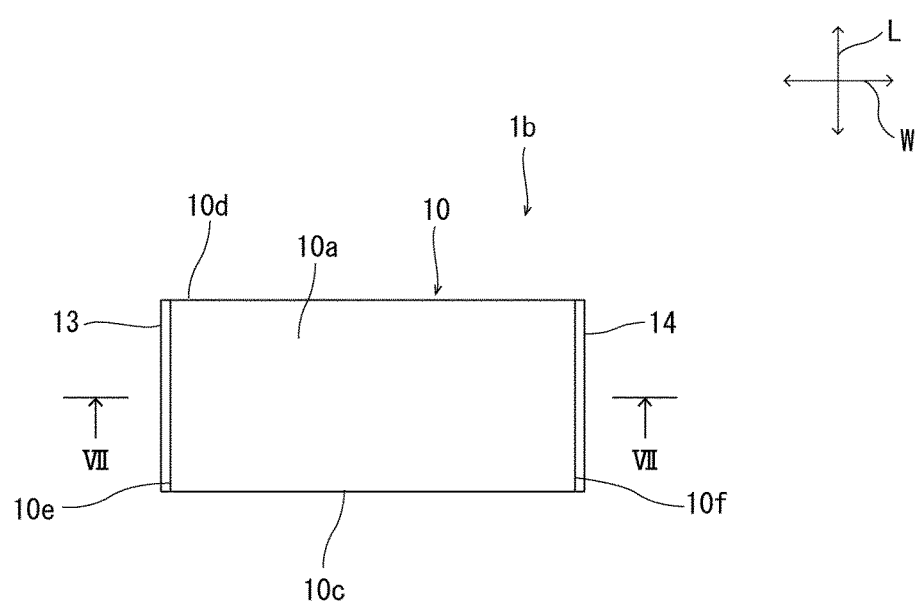
FIG. 6 is a schematic plan view of an electronic component according to a third preferred embodiment of the present invention.
Figure 7:
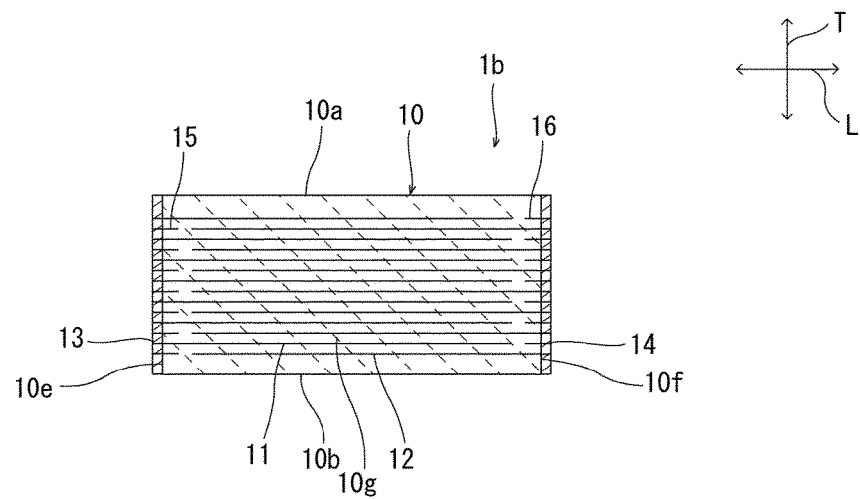
FIG. 7 is a schematic cross-sectional view taken along a VII-VII line in FIG. 6.

FIG. 6 is a schematic plan view of an electronic component according to a third preferred embodiment of the present invention. FIG. 7 is a schematic cross-sectional view taken along a VII-VII line in FIG. 6.

An electronic component 1b according to the third preferred embodiment differs from the electronic component 1 according to the first preferred embodiment in a point that the first outer electrode 13 is defined only by a conductive layer through which the first inner electrode 11 passes, and the second outer electrode 14 is defined only by a conductive layer through which the second inner electrode 12 passes. In various preferred embodiments of the present invention, it is sufficient for the first outer electrode at least to include a conductive layer through which the first inner electrode passes, and for the second outer electrode at least to include a conductive layer through which the second inner electrode passes.

A plating layer may be provided on at least one of the surfaces of the first outer electrode 13 and the second outer electrode 14.

Fourth Preferred Embodiment

Figure 8:
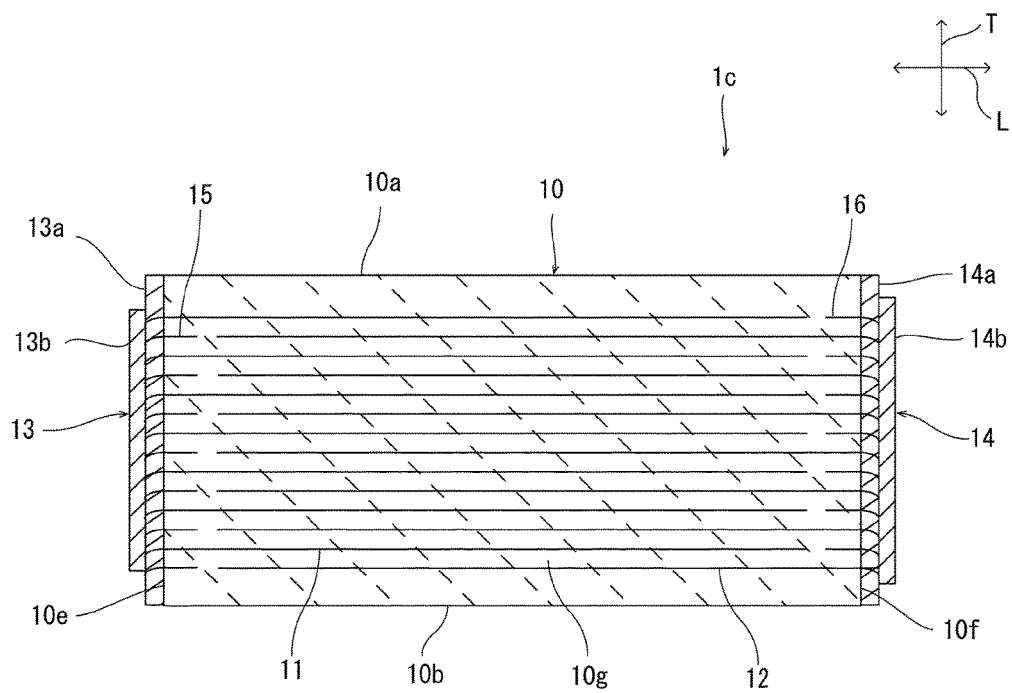
FIG. 8 is a schematic cross-sectional view of an electronic component according to a fourth preferred embodiment of the present invention.

FIG. 8 is a schematic cross-sectional view of an electronic component according to a fourth preferred embodiment of the present invention.

An electronic component 1c shown in FIG. 8 differs from the electronic component 1 according to the first preferred embodiment in a point that a portion inside the conductive layer 13a of the first inner electrode 11 and a portion inside the conductive layer 14a of the second inner electrode 12 each preferably include a curved or substantially curved shape when viewed in the width direction W.

In the present preferred embodiment, since a portion inside the conductive layer 13a of the first inner electrode 11 preferably has a curved or substantially curved shape, a contact area between the first inner electrode 11 and the conductive layer 13a is large. In addition, an anchor effect is generated due to the curved portion of the first inner electrode 11. As such, the reliability of connection between the first inner electrode 11 and the first outer electrode 13 is further increased.

Likewise, in the present preferred embodiment, since a portion inside the conductive layer 14a of the second inner electrode 12 preferably has a curved or a substantially curved shape, a contact area between the second inner electrode 12 and the conductive layer 14a is large. In addition, the anchor effect is generated due to the curved portion of the second inner electrode 12. As such, the reliability of connection between the second inner electrode 12 and the second outer electrode 14 is further increased.

A plating layer may be provided on at least one of the surfaces of the first outer electrode 13 and the second outer electrode 14.

Hereinafter, preferred embodiments of the present invention will be described in more detail based on specific working examples. However, the present invention is not limited to the following working examples in any way, and appropriate modifications are able to be carried out without departing from the scope and spirit of the present invention.

For example, a metal terminal may be connected to the first outer electrode 13, the second outer electrode 14, or the like. The metal terminal preferably is connected to the outer electrode by soldering, brazing with a brazing filler material of copper or the like, baking with a mixed paste of copper powder and glass powder, welding, or the like.

It is not absolutely necessary to provide the auxiliary electrodes 15 and 16.

Working Example 1

A non-limiting example of a multilayer ceramic capacitor having substantially the same structure as the electronic component 1 according to the first preferred embodiment was manufactured using the ink jet technique under the following conditions.

Multilayer ceramic capacitor size: about 8 mm×6 mm×4 mm

Dielectric layer thickness: about 20 µm on average

Inner electrode thickness: about 2.0 µm on average

Number of laminated inner electrodes: about 155 sheets

Distance between a principal surface and an inner electrode positioned at the most principal surface side: about 300 µm Dielectric layer: potassium zirconate Inner electrode and outer electrode: Ni containing common material (potassium zirconate) as ceramic particles Amount of common material contained in conductive layers 13a and 14a: about 40 volume %

Amount of common material contained in conductive layers 13b and 14b: about 0 volume %

Calcination of multilayer body: low-temperature degreasing was carried out first for about five hours at about 280° C. under a nitrogen atmosphere, and then high-temperature degreasing was carried out for about five hours at about 800° C.; and thereafter calcination was carried out for about five hours at about 1,330° C. under a reducing atmosphere.

Working Example 2

A non-limiting example of a multilayer ceramic capacitor was manufactured in the same manner as Working Example 1 except that an amount of common material contained in the conductive layers 13a and 13b was set to be about 55 volume %.

Working Example 3

A non-limiting example of a multilayer ceramic capacitor was manufactured in the same manner as Working Example 1 except that an amount of common material contained in the conductive layers 13a and 13b was set to be about 70 volume %.

Working Example 4

A non-limiting example of a multilayer ceramic capacitor was manufactured in the same manner as Working Example 1 except that an amount of common material contained in the conductive layers 13a and 13b was set to be about 40 volume % and an amount of common material contained in the conductive layers 13b and 14b was set to be about 10 volume %.

Working Example 5

A non-limiting example of a multilayer ceramic capacitor was manufactured in the same manner as Working Example 4 except that an amount of common material contained in the conductive layers 13a and 13b was set to be about 55 volume %.

Working Example 6

A non-limiting example of a multilayer ceramic capacitor was manufactured in the same manner as Working Example 4 except that an amount of common material contained in the conductive layers 13a and 13b was set to be about 70 volume %.

Working Example 7

A non-limiting example of a multilayer ceramic capacitor was manufactured in the same manner as Working Example 1 except that an amount of common material contained in the conductive layers 13a and 13b was set to be about 40 volume % and an amount of common material contained in the conductive layers 13b and 14b was set to be about 20 volume %.

Working Example 8

A non-limiting example of a multilayer ceramic capacitor was manufactured in the same manner as Working Example 7 except that an amount of common material contained in the conductive layers 13a and 13b was set to be about 55 volume %.

Working Example 9

A non-limiting example of a multilayer ceramic capacitor was manufactured in the same manner as Working Example 7 except that an amount of common material contained in the conductive layers 13a and 13b was set to be about 70 volume %.

Working Example 10

A non-limiting example of a multilayer ceramic capacitor was manufactured in the same manner as Working Example 5 except that the stated multilayer ceramic capacitor has substantially the same structure as the multilayer ceramic capacitor 1a according to the second preferred embodiment.

Working Example 11

A non-limiting example of a multilayer ceramic capacitor was manufactured in the same manner as Working Example 2 except that the stated multilayer ceramic capacitor has substantially the same structure as the multilayer ceramic capacitor 1b according to the third preferred embodiment.

Comparative Example 1

Figure 9:
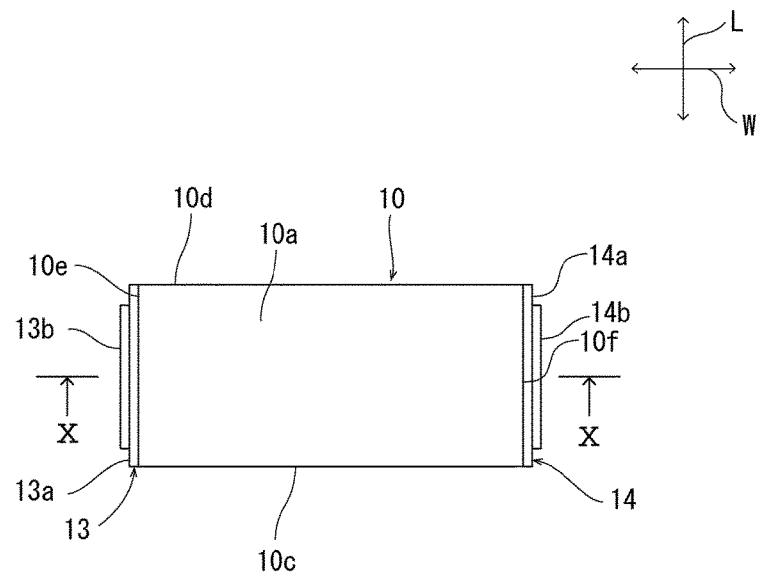
FIG. 9 is a schematic plan view of an electronic component manufactured in Comparative Example 1.
Figure 10:
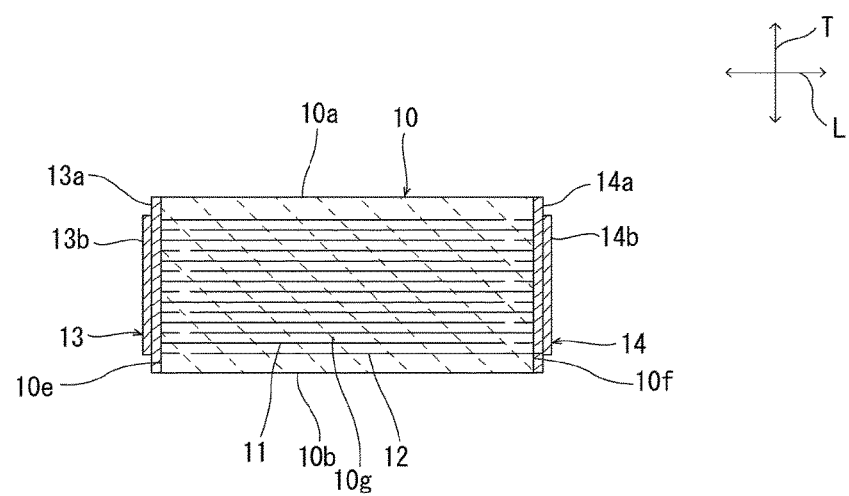
FIG. 10 is a schematic cross-sectional view taken along a X-X line in FIG. 9.

A multilayer ceramic capacitor was manufactured in the same manner as Working Example 5 except that the inner electrodes 11 and 12 were not provided inside the conductive layers 13a and 14a, as shown in FIGS. 9 and 10.

Comparative Example 2

Figure 11:
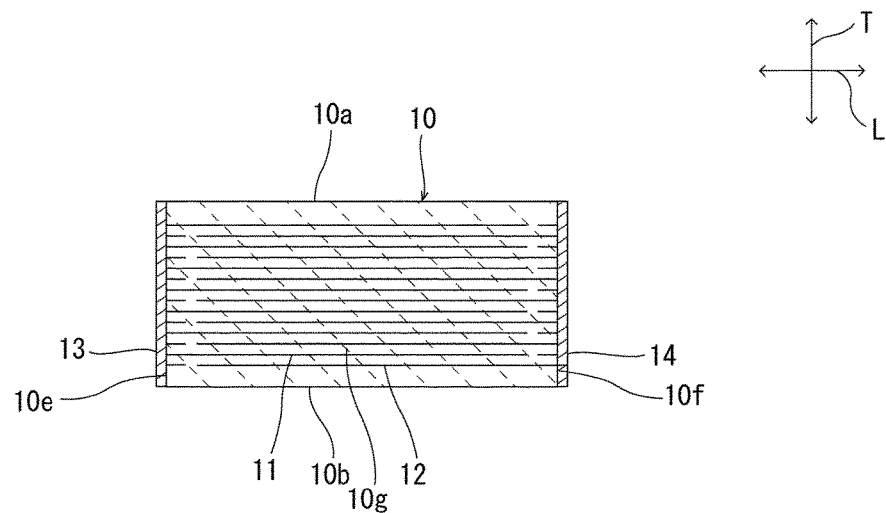
FIG. 11 is a schematic cross-sectional view in which a portion of an electronic component manufactured in Comparative Example 2 is enlarged and illustrated.

A multilayer ceramic capacitor was manufactured in the same manner as Comparative Example 1 except that the conductive layers 13b and 14b were not provided, as shown in FIG. 11.

Measurement of Contained Amount of Common Material

A contained amount of common material was obtained using the method as described in the first preferred embodiment. The observation under the scanning microscope was carried out at a magnification of 1,000.

Measurement of ESR

Figure 12:
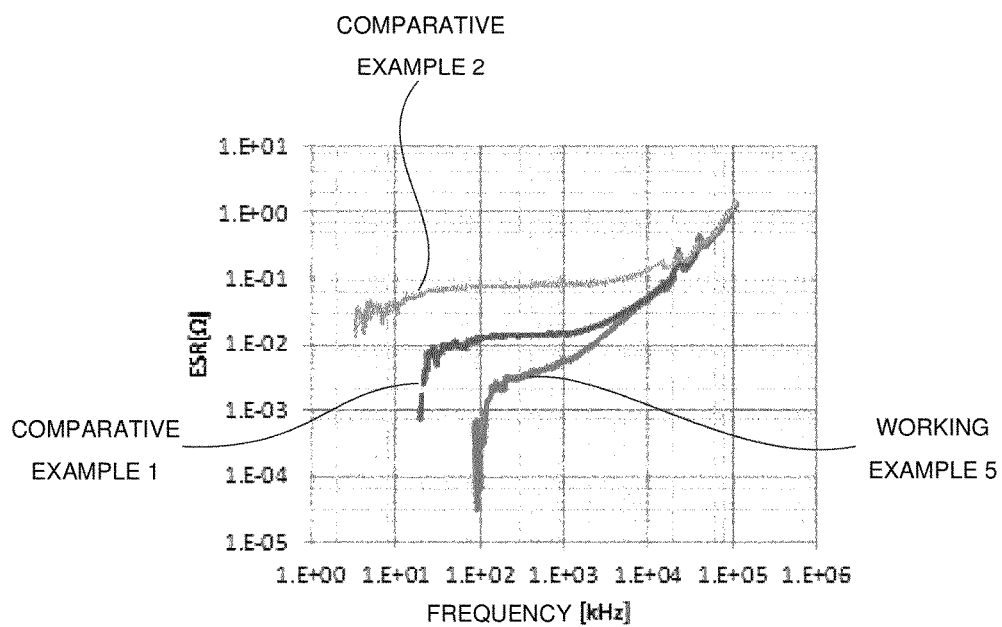
FIG. 12 is a graph depicting ESR values of Working Example 5, Comparative Example 1, and Comparative Example 2.

Sample ESRs manufactured in the above-described Working Examples and Comparative Examples were measured at 1 MHz using PRECISION LCR METER "E4980A" and TEST FIXTURE "16044A" made by Agilent Technologies. The ESR measurement was carried out on each five samples of the respective Working Examples and Comparative Examples, and the average thereof was taken as an ESR value. The measurement results are shown in Table 1. The ESR values of Working Example 5, Comparative Example 1, and Comparative Example 2 are depicted in FIG. 12.

Evaluation of Presence/Absence of Crack Generation

Ten samples were manufactured in each Working Example and Comparative Example; the first side surface of each sample was polished parallel or substantially parallel to the first side surface until the width thereof became substantially half the width before the polishing, and abrasive sagging was removed by ion milling, thereby exposing a cross section. The exposed cross section was observed to confirm the presence/absence of a crack. The results are shown in Table 1.

TABLE 1

| | Amount of Common Material Contained in Conductive Layers 13a, 14a (Volume %) | Amount of Common Material Contained in Conductive Layers 13b, 14b (Volume %) | ESR Value (mΩ) | Number of Generated Cracks/ Number of Samples |
|---|---|---|---|---|
| Working Example 1 | 40 | 0 | 4 | 0/10 |
| Working Example 2 | 55 | 0 | 5 | 0/10 |
| Working Example 3 | 70 | 0 | 5 | 0/10 |
| Working Example 4 | 40 | 10 | 4 | 0/10 |
| Working Example 5 | 55 | 10 | 5 | 0/10 |
| Working Example 6 | 70 | 10 | 5 | 0/10 |
| Working Example 7 | 40 | 20 | 4 | 0/10 |
| Working Example 8 | 55 | 20 | 5 | 0/10 |
| Working Example 9 | 70 | 20 | 5 | 0/10 |
| Working Example 10 | 55 | 10 | 5 | 2/10 |
| Working Example 11 | 55 | — | 11 | 0/10 |
| Comparative Example 1 | 55 | 10 | 14 | 0/10 |
| Comparative Example 2 | 55 | — | 78 | 0/10 |

From Table 1, it can be understood that the ESR value is lowered by using a structure in which the inner electrodes 11 and 12 pass through the conductive layers 13a and 14a, respectively.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
    an electronic component main body including first and second principal surfaces that extend along a lengthwise direction and a width direction, first and second side surfaces that extend along the lengthwise direction and a lamination direction, and first and second end surfaces that extend along the width direction and the lamination direction;
    a first inner electrode provided inside the electronic component main body;
    a second inner electrode provided inside the electronic component main body;
    a first outer electrode that is provided on the first end surface and is connected to the first inner electrode; and
    a second outer electrode that is provided on the second end surface and is connected to the second inner electrode; wherein
    the first outer electrode includes a first conductive layer provided on the first end surface;
    the second outer electrode includes a second conductive layer provided on the second end surface; and
    the first inner electrode passes through only the first conductive layer.

2. The electronic component according to claim 1, wherein the second inner electrode passes through the second conductive layer.

3. The electronic component according to claim 1, wherein
    the first outer electrode further includes a third conductive layer provided on the first conductive layer;
    of the first and third conductive layers, at least the first conductive layer includes ceramic particles; and
    an amount of ceramic particles included in the first conductive layer is greater than an amount of ceramic particles included in the third conductive layer.

4. The electronic component according to claim 1, wherein
    the second outer electrode further includes a fourth conductive layer provided on the second conductive layer;
    of the second and fourth conductive layers, at least the second conductive layer includes ceramic particles; and
    an amount of ceramic particles included in the second conductive layer is greater than an amount of ceramic particles included in the fourth conductive layer.

5. The electronic component according to claim 3, wherein the third conductive layer is separated from the electronic component main body by the first conductive layer.

6. The electronic component according to claim 4, wherein the fourth conductive layer is separated from the electronic component main body by the second conductive layer.

7. The electronic component according to claim 1, wherein a portion of the first inner electrode inside the first conductive layer has a curved or substantially curved shape when viewed in a width direction.

8. The electronic component according to claim 2, wherein a portion of the second inner electrode inside the second conductive layer has a curved or substantially curved shape when viewed in the width direction.

9. The electronic component according to claim 1, wherein the electronic component is one of a ceramic capacitor, a piezoelectric component, a thermistor, and an inductor.

10. The electronic component according to claim 1, wherein the first inner electrode passes through the first conductive layer along an entire region in the width direction.

11. The electronic component according to claim 1, wherein the first outer electrode further includes a third conductive layer provided on the first conductive layer and the second outer electrode further includes a fourth conductive layer provided on the second conductive layer, each of the third and fourth conductive layers includes a relatively small amount of ceramic particles and has a significantly different rate of shrinkage from that of the electronic component main body, and each of the first and second conductive layers contains a relatively large amount of ceramic particles and has a rate of shrinkage that is the same or substantially the same as that of the electronic component main body.

12. The electronic component according to claim 11, wherein each of the third and fourth conductive layers is respectively separated from the electronic component main body by the first and second conductive layers.

13. The electronic component according to claim 1, further comprising first and second auxiliary electrodes provided inside the electronic component main body and connected to respective ones of the first and second outer electrodes.

14. The electronic component according to claim 13, wherein the first auxiliary electrode passes through the first conductive layer and the second auxiliary electrode passes through the second conductive layer.

* * * * *